United States Patent [19]
Ducourant

[11] Patent Number: 4,780,687
[45] Date of Patent: Oct. 25, 1988

[54] DIFFERENTIAL AMPLIFIER CIRCUIT FOR REGENERATING LOW-AMPLITUDE COMPLEMENTARY SIGNALS

[75] Inventor: Thierry Ducourant, Crosne, France

[73] Assignee: U.S. Philips Corporation, New York, N.Y.

[21] Appl. No.: 57,560

[22] Filed: Jun. 3, 1987

[30] Foreign Application Priority Data

Jun. 10, 1986 [FR] France .................. 86 08369

[51] Int. Cl.$^4$ ............................................. H03F 3/45
[52] U.S. Cl. .................................... 330/253; 307/355; 307/497
[58] Field of Search ................ 330/253, 255; 307/355, 307/356, 497, 530; 365/189, 207, 208

[56] References Cited

U.S. PATENT DOCUMENTS 4,247,791 1/1981 Rovell ............................ 365/190 X

FOREIGN PATENT DOCUMENTS 0154501 9/1985 European Pat. Off. ............ 330/253

*Primary Examiner*—James B. Mullins
*Attorney, Agent, or Firm*—Thomas A. Briody; Algy Tamoshunas; Steven R. Biren

[57] ABSTRACT

A differential amplifier circuit for regenerating complementary analog signals of low amplitude includes a differential pair of field effect transistors whose common sources are connected to a first supply voltage $V_{SS}$ via a load, a pair of loads which are connected to the drain of each transistor of the differential pair and to a second supply voltage, respectively, and a level regenerating circuit having a pair of diodes for deriving the signals from the drain of each transistor of the differential pair. The signals transported by the diodes are applied to the lower transistor of a pair of push-pull stages whose upper transistor directly receives the signal derived from the drain of the other transistor of the differential pair, while the source of the lower transistors of the push-pull stages is connected to ground and the drain of the upper transistor of these stages is connected to the second supply voltage $V_{DD}$, the complementary amplified output signals being available at the central points of the push-pull stages.

2 Claims, 2 Drawing Sheets

DIFFERENTIAL AMPLIFIER CIRCUIT FOR REGENERATING LOW-AMPLITUDE COMPLEMENTARY SIGNALS

BACKGROUND OF THE INVENTION

The invention relates to a differential amplifier circuit for regenerating complementary analog signals of a low amplitude, which includes a differential pair of field effect transistors whose common sources are connected to a first supply voltage via a load, a pair of loads which are connected to the drain of each transistor of the differential pair and to a second supply voltage, respectively, and a level regenerating circuit, having a diode for deriving the signals from the drain of one transistor of the differential pair.

This type of circuit is used for regenerating complementary analog signals having a low amplitude and a variable mean d.c. value for static memories with a medium and high integration density in integrated circuit technology based on gallium arsenide (GaAs).

A differential amplifier circuit of this kind is shown from European patent application No. 0,154,501. This document describes a differential amplifier circuit which comprises a differential pair of field effect transistors whose coupled sources are connected to a dc potential via a current source. The drains of the transistors of the differential pair are connected to a second d.c. supply voltage via a pair of loads. Each drain is also connected to the other drain via a diode. the objects of this known circuit are to reduce the instability of the low level, to increase the gain, and to maintain a low power consumption and a fast response.

However, such a circuit is not suitable for supplying output signals whose mean level is fixed, regardless of the input signals. Moreover, the output signals are highly dependent on capacitive loads. Therefore, such a circuit is essentially connected to a second differential circuit.

However, for the intended application in static memories, the output signals of such a differential amplifier must be strictly complementary, calibrated as regards amplitude and above all as regards absolute value as well as switching time, and must also be directly compatible with the so-called DCFL logic (Direct Coupled FET Logic). This means not only that the difference between the high level and the low level on the output must be constant, regardless of the input levels, but also that the mean value of this difference must have a fixed level, regardless of the level of the mean value of the difference between the input levels. Actually, in the memories the mean value of the difference between the high levels and the low levels often "floats". Therefore, these signals cannot be used for later processing, because they lead to ambiguous situations. Moreover, a high gain must be realized, because the signals supplied by the memories often have a low amplitude. Finally, the intended circuit must be insensitive to capacitive loads.

SUMMARY OF THE INVENTION

In accordance with the invention, the described objects are achieved by means of a circuit as described above which is characterized in that the signals transported by the diode are applied to the lower transistor of a push-pull stage whose upper transistor directly receives the signal derived from the drain of the other transistor of the differential pair, the source of the lower transistor of the push-pull stage being connected to ground and the drain of the upper transistor of this stage being connected to the second supply voltage, the amplified output signal being available at the central point of the push-pull stage.

The circuit in accordance with the invention thus offers inter alia the following advantages:
- the output signals are strictly complementary,
- the internal logic levels have a very good noise margin,
- the push-pull stage allows for the presence of high capacitive loads,
- the logic output levels are perfectly calibrated as regards amplitude and absolute value. The mean level of their difference is fixed and independent of the mean level of the difference between the logic input levels,
- the output signals of the differential amplifier are loaded by the capacitance of a diode and a field effect transistor in series, that is to say by a low capacitance, and
- the circuit is compatible with DCFL logic.

BRIEF DESCRIPTION OF THE DRAWINGS

The invention will be described in detail hereinafter with reference to the accompanying diagrammatic drawing, in which.

DESCRIPTION OF THE PREFERRED EMBODIMENT

Figure 1:
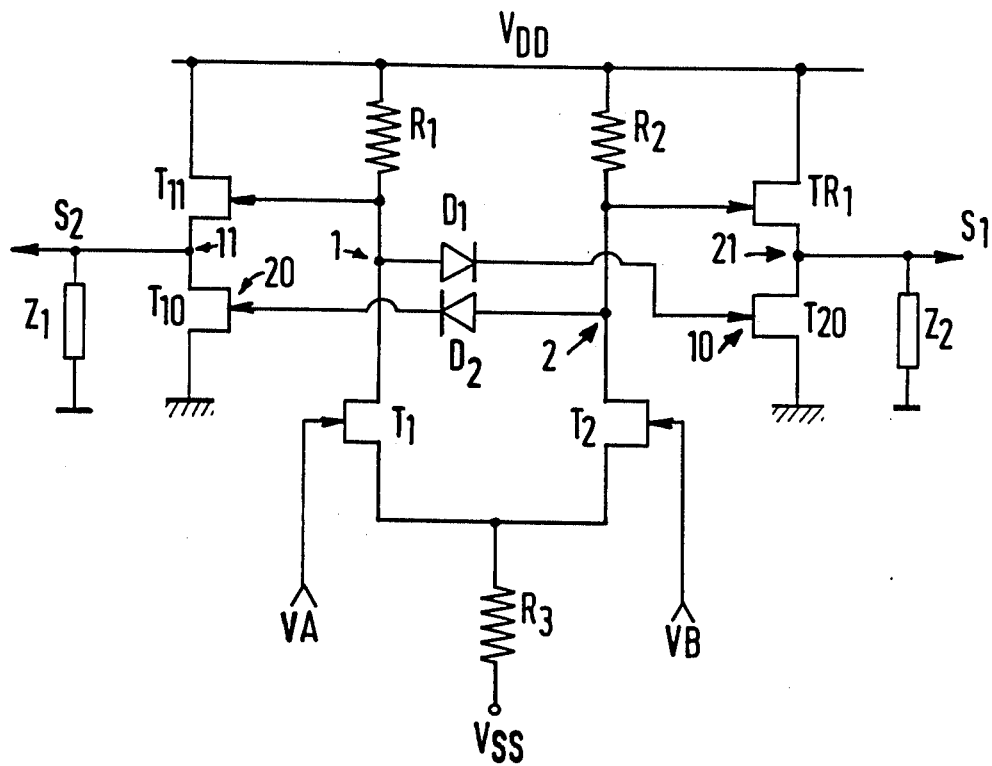
FIG. 1 shows the diagram of the circuit in accordance with the invention.

As appears from FIG. 1, the differential amplifier circuit in accordance with the invention comprises a differential pair of field effect transistors $T_1$ and $T_2$, the coupled sources of which are connected to a first dc supply voltage $V_{SS}$ via a load $R_3$.

The gate of the transistor $T_1$ is controlled by a first voltage $V_A$ and the gate of the transistor $T_2$ is controlled by a second voltage $V_B$.

The drains of the transistors $T_1$ and $T_2$ of the differential pair are connected to a second d.c. supply voltage $V_{DD}$ via loads $R_1$ and $R_2$, respectively.

The circuit in accordance with the invention also comprises a pair of push-pull stages. The first one of these stages is formed by the lower transistor $T_{10}$ whose source is connected to ground and by the upper transistor $T_{11}$ whose drain is connected to the second supply voltage $V_{DD}$. The lower transistor $T_{10}$ of this push-pull stage is controlled by the signal derived from the drain of the second transistor $T_2$ via at least one diode $D_2$. The upper transistor $T_{11}$ of the same push-pull stage is controlled by the signal derived directly from the drain of the first transistor $T_1$ of the differential pair.

The second push-pull stage is formed by the lower transistor $TR_1$ whose source is connected to ground and by the upper transistor $T_{21}$ whose drain is connected to the second supply voltage $V_{DD}$. The lower transistor $T_{20}$ is controlled by the signal derived from the drain of the first transistor $T_1$ of the differential pair via at least one diode, in this case $D_1$. The upper transistor $TR_1$ is controlled by the signal directly derived from the drain of the second transistor $T_2$ of the differential pair.

Preferably, the circuit is realized by means of field effect transistors of the MESFET type (Metal, Semiinsulating FET), normally pinched-off in the absence of the gate-source signal, formed on a gallium arsenide (GaAs) substrate.

The loads $R_1$, $R_2$, $R_3$ are formed by resistors realized in the active zone formed in the course of manufacture of the MESFETS.

The output signals of the device appear at the points 11 and 21, the central points of the first and the second push-pull stage, respectively, across the loads $Z_1$ and $Z_2$.

Figure 2:
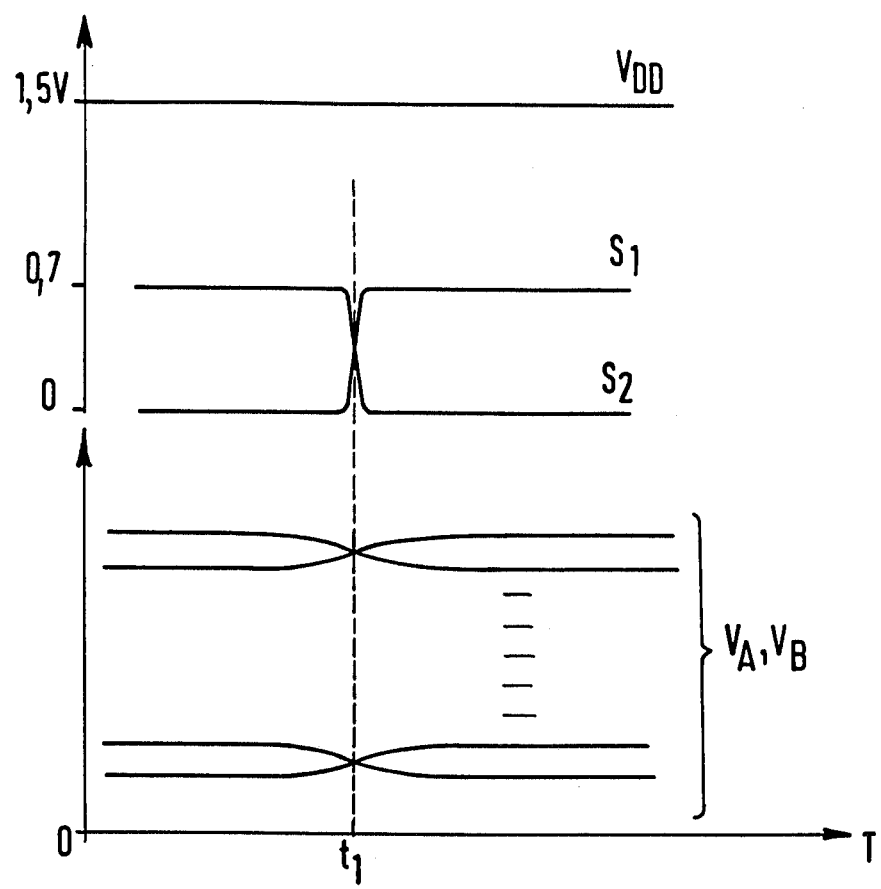
FIG. 2 shows the sequencing of the signals in this circuit.

As appears from FIG. 2, when the voltage $V_B$ is higher than the voltage $V_A$ on the input, the transistor $T_2$ of the differential pair is more conductive than the transistor $T_1$. The signal at the point 2 (see FIG. 1) on the drain of the transistor $T_2$, therefore, has a low level while the signal on the point 1 on the drain of the transistor $T_1$ approximates the value of the second d.c. supply voltage $V_{DD}$, i.e the high level.

In these circumstances, the point 10 is automatically biased to the clipping voltage of the diode $D_1$ and sets the lower transistor $T_{20}$ of the second push-pull stage to the highly conductive state. The diode $D_1$ conducts and causes a potential drop across its terminals which is equal to its clipping voltage. However, the signals on the points 2 and 20, that is to say on the drain of the second transistor $T_2$ of the differential pair and on the gate of the lower transistor of the first push-pull stage, respectively, approximate 0, thus turning off the transistors $T_{10}$ and $TR_1$. The diode $D_2$ is not conductive.

The upper transistor of the first push-pull stage thus imposes the logic state 1 in the load $Z_1$, while at the same instant the upper transistor $TR_1$ of the second push-pull stage imposes the state 0 in $Z_2$.

When the circuit in accordance with the invention is realized by means of MESFET transistors, in an embodiment in accordance with the invention:
the d.c. supply voltage $V_{DD}=1.4$ V;
the dc supply voltage $V_{SS}$ can be chosen between the values $-1.4$ V and ground (OV);
the clipping voltage of the diodes is approximately 0.7 V;
the internal logic levels thus have an amplitude of 1.4 V; and so that they have a suitable noise margin, the output levels are calibrated to 0 and 0.7 V with a fixed mean value of 0.350 V, regardless of the input levels of $V_A$ and $V_B$.

The MESFET transistors preferably have a gate width $L=20$ $\Omega$
and a pinch-off voltage $V_T=50$ mV.
The value of the resistive loads is:
$R_1=R_2=2$ k$\Omega$
$R_3=1$ K$\Omega$
$Z_1=Z_2=2$ k$\Omega$.

The output capacitances of the circuit are equivalent to the capacitance of one diode ($D_1$ or $D_2$) in series with the capacitance of the lower transistor of the corresponding push-pull stage, that is to say a low capacitance which is less than approximately 10 fF.

What is claimed is:

1. A differential amplifier circuit for regenerating complementary analog signals of low amplitude, comprising a first load and a differential pair of field effect transistors whose common sources are connected through said first load to a first supply voltage, second and third loads which are connected to the drain of each transistor of the differential pair and to a second supply voltage, respectively, a level regenerating circuit, comprising a diode for deriving the signals from the drain of one transistor of the differential pair, and a push-pull stage having upper and lower series-connected field effect transistors, signals transported by said diode being applied to the lower transistor of said push-pull stage, whose upper transistor directly receives the signal derived from the drain of the other transistor of the differential pair, the source of the lower transistor of the push-pull stage being connected to ground and the drain of the upper transistor of the push-pull stage being connected to the second supply voltage, the amplified output signal being available at a common central connection point of the push-pull stage.

2. A circuit as claimed in claim 1, characterized in that it is monolithically integrated on a gallium arsenide (GaAS) substrate by means of field effect transistors which are normally pinched off in the absence of the gate source signal and resistive loads.

* * * * *